United States Patent
Otremba et al.

(10) Patent No.: US 8,115,294 B2
(45) Date of Patent: Feb. 14, 2012

(54) MULTICHIP MODULE WITH IMPROVED SYSTEM CARRIER

(75) Inventors: Ralf Otremba, Kaufbeuren (DE); Xaver Schloegel, Sachsenskam (DE)

(73) Assignee: Infineon Technologies AG, Munich (DE)

( * ) Notice: Subject to any disclaimer, the term of this patent is extended or adjusted under 35 U.S.C. 154(b) by 946 days.

(21) Appl. No.: 11/687,346

(22) Filed: Mar. 16, 2007

(65) Prior Publication Data

US 2007/0216011 A1    Sep. 20, 2007

(30) Foreign Application Priority Data

Mar. 17, 2006    (DE) .................... 10 2006 012 781

(51) Int. Cl.
    *H01L 23/52* (2006.01)
(52) U.S. Cl. ........................................ 257/690
(58) Field of Classification Search ............ 257/690
    See application file for complete search history.

(56) References Cited

U.S. PATENT DOCUMENTS

| | | | |
|---|---|---|---|
| 5,559,374 A | 9/1996 | Ohta et al. | |
| 5,851,855 A * | 12/1998 | Ferla et al. | 438/129 |
| 6,388,344 B1 | 5/2002 | Klotz et al. | |
| 6,809,411 B2 | 10/2004 | Hierholzer | |
| 6,979,909 B2 * | 12/2005 | Shinohara | 257/796 |
| 6,987,670 B2 | 1/2006 | Ahmed et al. | |
| 7,145,224 B2 * | 12/2006 | Kawashima et al. | 257/678 |
| 2004/0041251 A1 * | 3/2004 | Goller et al. | 257/690 |
| 2005/0087849 A1 | 4/2005 | Morita et al. | |

FOREIGN PATENT DOCUMENTS

| | | |
|---|---|---|
| DE | 19725836 | 12/1998 |
| DE | 19927285 | 12/2000 |
| DE | 102004021054 | 11/2005 |
| DE | 102005007373 | 8/2008 |
| WO | 2006087065 | 8/2006 |

OTHER PUBLICATIONS

Examination Reported for DE102006012781.1-33 dated Dec. 19, 2006.

* cited by examiner

*Primary Examiner* — Samuel Gebremariam
(74) *Attorney, Agent, or Firm* — Banner & Witcoff, Ltd.

(57) ABSTRACT

A power semiconductor device has a first chip carrier part (11) and a second chip carrier part (12), the first chip carrier part (11) and the second chip carrier part (12) being spaced apart from one another and being electrically conductive in each case. A first chip with a power transistor is arranged on the first chip carrier part (11) and a second chip (14) is arranged on the second chip carrier part (12). The terminal for a first potential (DC−) of a supply voltage is electrically connected to the first chip (13) via the first chip carrier part and the terminal for the second potential of a supply voltage (DC+) is electrically connected to the second chip (14) via the second chip carrier part.

18 Claims, 9 Drawing Sheets

FIG 2A
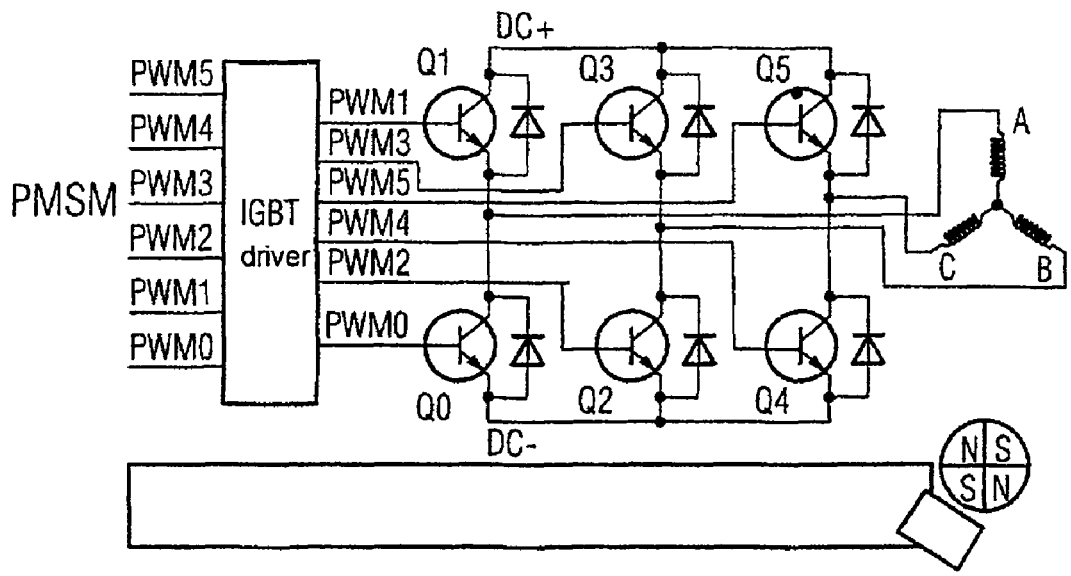
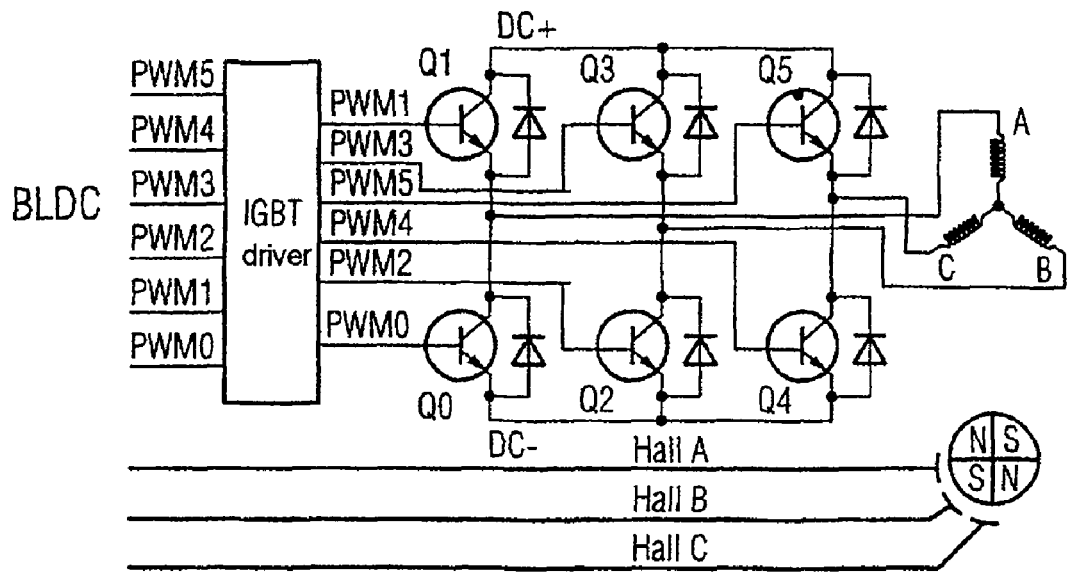

FIG 2B
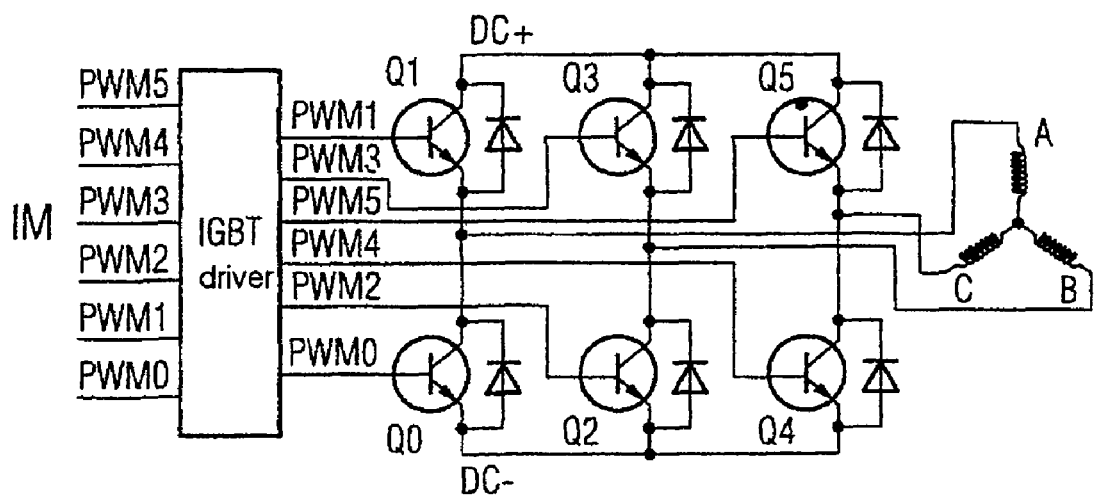
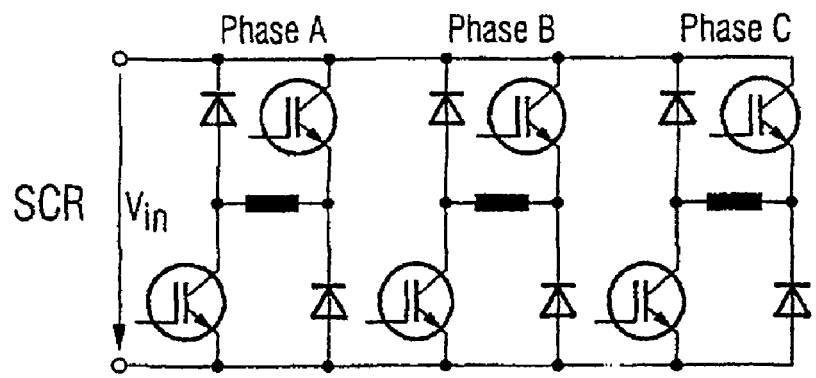

FIG 3
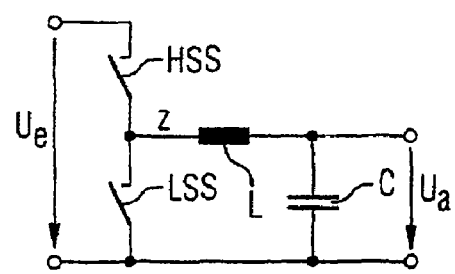
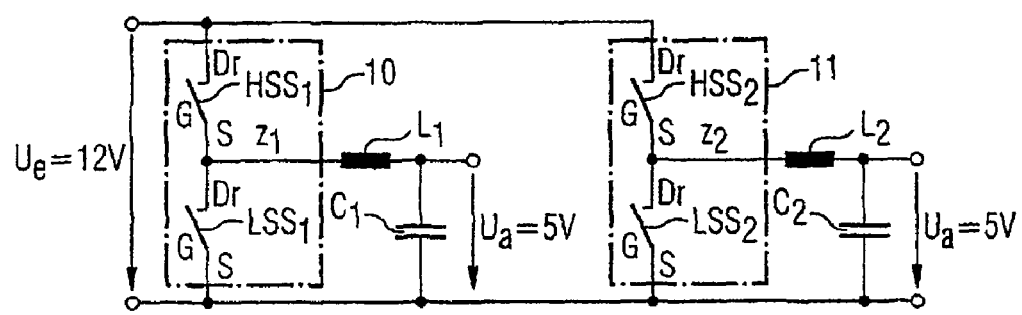
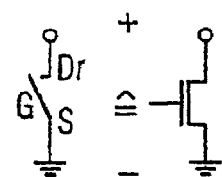

MULTICHIP MODULE WITH IMPROVED SYSTEM CARRIER

RELATED APPLICATION

This application claims priority from German Patent Application No. DE 10 2006 012 781.1, which was filed on Mar. 17, 2006, and is incorporated herein by reference in its entirety.

TECHNICAL FIELD

The invention relates to a multichip module with an improved system carrier.

BACKGROUND

In some applications of power semiconductors, such as e.g. in bridge circuits for motors, a plurality of chips are accommodated together in a housing. A device in which a plurality of chips are accommodated in a housing is referred to as a multichip module (MCM). By combining the chips in a housing, on the one hand space for the overall system is saved and on the other hand connecting lines between the chips are shortened.

In the case of integration in a housing, the problem arises of connecting the individual chips in each case with the lowest possible impedance. In DE 197 25 836, power semiconductor chips are accommodated on a copper-coated DCB substrate composed of a ceramic (DCB=Direct Copper Bonding). Although they are distinguished by a good thermal conductivity, they have the disadvantage that they are expensive to produce.

SUMMARY

A power semiconductor device comprising a plurality of chips which can be produced more cost-effectively than conventional power semiconductor devices.

According to an embodiment, a power semiconductor device may comprise a chip carrier having a first chip carrier part and at least one second chip carrier part, the first chip carrier part and the second chip carrier part being fitted at a distance from one another and being electrically conductive in each case, at least one first chip, which contains a power transistor and is arranged on the first chip carrier part, at least one second chip, which contains a power transistor and is arranged on the second chip carrier part, terminals for a supply voltage having a first potential and a second potential, wherein the terminal for the first potential is electrically connected to the first chip carrier part and the terminal for the second potential is electrically connected to the second chip carrier part, and wherein the electrical connection of the first chips to the first potential is effected via the first chip carrier part, and the electrical connection of the second chip to the second potential is effected via the second chip carrier part.

BRIEF DESCRIPTION OF THE DRAWINGS

The invention is illustrated in more detail on the basis of an exemplary embodiment in the drawings.

FIG. 2 shows circuit diagrams of applications for power semiconductor devices according to an embodiment.

FIG. 3 shows further applications of the power semiconductor device according to an embodiment.

DETAILED DESCRIPTION

Figure 1:
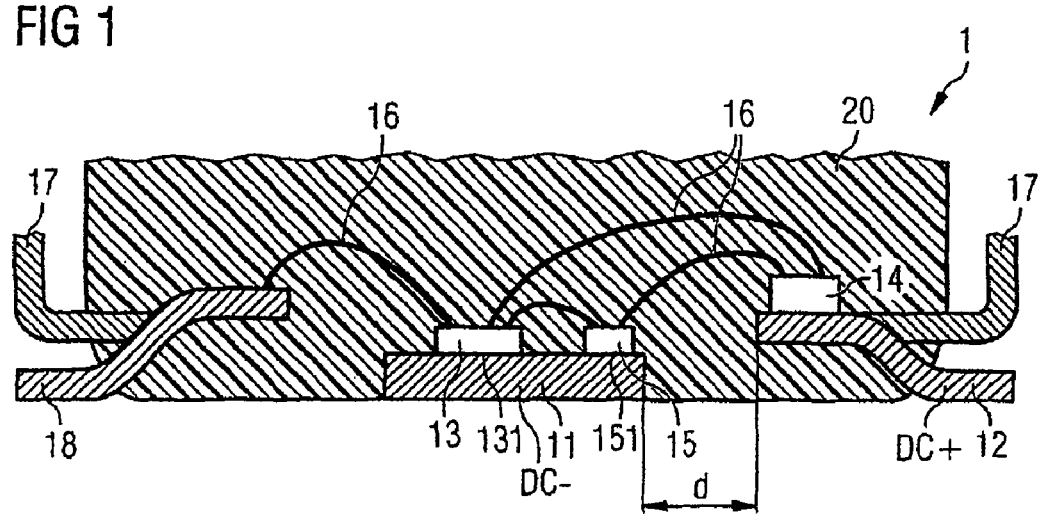
FIG. 1 shows a power semiconductor device according to an embodiment.

According to an embodiment, a power semiconductor device having a chip carrier may contain at least one first chip carrier part and at least one second chip carrier part. The first chip carrier part and the second chip carrier part are spaced apart from one another and are electrically conductive in each case.

According to an embodiment, at least one first chip with a power transistor is arranged on the first chip carrier part and a second chip, likewise with a power transistor, is arranged on the second chip carrier. The power semiconductor device has terminals by means of which a first potential and a second potential of a supply voltage can be connected externally to the power semiconductor device. The terminal for the first potential is electrically connected to the electrically conductive first chip carrier part and the terminal for the second potential is electrically connected to the electrically conductive second chip carrier part.

According to an embodiment, the electrical connection of the first chip to the first potential is effected via the first chip carrier and the electrical connection of the second chip to the second potential is effected via the second chip carrier.

By virtue of the arrangement shown, according to an embodiment, the chips are advantageously distributed on the chip carrier parts in such a way that the supply with the potentials of the supply voltage is at the lowest possible impedance. The space in the power semiconductor device is utilized effectively by means of the chips with their power transistors being accommodated on a plurality of chip carrier parts. Such a power semiconductor device can be produced significantly more favorably than a DCB module containing an expensive copper-coated substrate.

According to an embodiment, if the first chip carrier part and the second chip carrier part are leads, the latter can be positioned in a simple manner by means of a leadframe, which makes the production process less expensive. The power semiconductor device preferably contains a housing composed of a molding composition which encloses the first chip, the second chip and at least one of the chip carrier parts. The molding composition not only serves for mechanical protection of the first and second chips, but also forms an electrical insulation in the interspaces between first and second chip carrier part, which are at different potentials of the supply voltage.

According to an embodiment, at least one side of one of the chip carrier parts is accessible from outside the housing. This is important in order to fix the chip carrier part on a heat sink. This is particularly necessary for multichip modules embodied as lead-through housings or SMD housings.

According to an embodiment, if the first chip and the second chip are applied on the first chip carrier part and on the second chip carrier, respectively, in each case by means of diffusion soldering connections, this results in a small distance between the chips and the chip carrier parts lying under them. This reduces the structural height of the power semiconductor device. Diffusion soldering additionally affords the advantage that the soldering process is effected at a relatively low temperature of between 200° C. and 400° C. The intermetallic compound that forms as a result of the soldering process has a higher melting point than the soldering temperature after soldering. Particularly thermostable power semiconductor devices can be produced as a result.

According to an embodiment, the first chip is arranged on the first chip carrier part in such a way that the control input, e.g. the gate or the base, of the power transistor is fitted on the side lying at the bottom. The control input is electrically connected to a terminal for the control input on the side lying at the top via a feedthrough through the chip. In contrast, the control input of the power transistor of the second chip is fitted on the side lying at the top.

According to an embodiment, the feedthrough through the first chip may be produced e.g. by an etching through the chip and a subsequent filling of the resulting hole by means of a metal. The arrangement that exists ensures that the source side lies opposite the chip carrier part in one of the two chips and the drain side lies opposite the chip carrier part in the other chip.

According to an embodiment, contact layers are in each case accommodated between the first chip carrier part and the first chip and between the second chip carrier part and the second chip in order to increase the distance between the chips and the chip carrier parts. This is important in the case of different potentials on the surface of the chip and on the chip carrier part, as a result of which a breakdown can occur. By means of the additional contact layer, the distance is increased and a molding composition situated in the interspaces between first chip and chip carrier part increases the dielectric strength.

I According to an embodiment, a third chip with an integrated driving arrangement for power transistors is situated on one of the chip carrier parts. This means that the driving arrangement for the control inputs of the power transistors on the first and the second chip is additionally integrated in the power semiconductor device, as a result of which the structural volume of the assembly comprising control circuit and power transistors is reduced further.

According to an embodiment, the power transistors may be MOSFETs, IGBTs, thyristors or bipolar transistors.

According to an embodiment, the power semiconductor component contains a bridge circuit with a high-side switch and a low-side switch, wherein the low-side switch is integrated in the first chip and the high-side switch is integrated in the second chip. The high-side switch and the low-side switch lie on different chip carrier parts and are supplied with the potentials of the supply voltage directly via the chip carrier parts lying under them.

According to an embodiment, in one extension, the power semiconductor component additionally contains a third chip and a fourth chip, which in each case have a diode. The first chip and the third chip are arranged on the first chip carrier part and are electrically connected to the first chip carrier part by a respective contact area on their sides lying at the bottom. The second chip and the fourth chip are arranged on the second chip carrier part and are electrically connected to the second chip carrier part by a respective contact area on the side lying at the bottom. With this construction, power transistors and the freewheeling diodes connected in parallel can be accommodated alongside one another on the chip carrier parts, the terminal for the diode with the potential of the supply voltage likewise being embodied with low impedance.

According to an embodiment, the power semiconductor component contains three chips with high-side switches and three chips with low-side switches and also six diodes. The low-side switches are applied with a respective diode to the first chip carrier part and the high-side switches are applied with three diodes to the second chip carrier part. In this embodiment, the power devices required, and also associated freewheeling diodes of a motor controller, are completely accommodated in a power semiconductor component. In this case, the terminals for the supply voltage are embodied with particularly low impedance.

According to an embodiment, a chip with a diode is in each case applied on the high-side switches and on the low-side switches. In this embodiment, the diode and power transistors are no longer arranged alongside one another, but rather one above another. This results in an even more compact design.

According to an embodiment, the power semiconductor component may be preferably accommodated in a TO or PowerSO housing. These standard housings can be produced particularly cost-effectively because they have already been commercially available for a long time. Moreover, such a power semiconductor device can be integrated into existing applications since the dimensions of the housing do not differ from those of conventional power semiconductor components.

According to an embodiment, in a method for producing a power semiconductor device, an electrically conductive first chip carrier part and an electrically conductive second chip carrier part are provided, the first chip carrier part being connected to a terminal for the first potential of a supply voltage and the second chip carrier part being connected to a terminal for the second potential of a supply voltage. A first chip is arranged on the first chip carrier part and a second chip is arranged on the second chip carrier part. This gives rise to an electrical connection between a contact area situated on the underside of the first chip and the first chip carrier part and an electrical connection between a contact area situated on the underside of the second chip and the second chip carrier part. The method provides a power semiconductor device in which the connections to the supply voltage potentials have particularly low impedance. The chip carrier is divided into two parts which in each case serve for supply with a supply voltage. This obviates at least one bonding wire for the supply voltage of one of the chips.

According to an embodiment, the first chip and the second chip in each case have a control input on their active top side. The control input of the first chip is electrically connected to a terminal for the control input on the rear side via a feedthrough through the first chip. The first chip is arranged on the first chip carrier part with its active top side downward and the second chip is arranged on the second chip carrier part with its active top side upward. Afterward, the control inputs of the first chip and of the second chip are in each case contact-connected from above. By turning over the first chip, the load path can be connected to the underlying first chip carrier part with low impedance. In addition, this solves the problem of how the control inputs can additionally be contact-connected.

FIG. 1 shows a power semiconductor device in cross section. The power semiconductor device 1 has a housing 20 composed of a molding composition, e.g. composed of epoxy resin. A first chip carrier part 11 and a second chip carrier part 12 are fitted in said power semiconductor device. The chip carrier parts 11 and 12 are parts of a leadframe that additionally contains the leads 18 and 17. A first chip 13 and a third chip 15 are arranged on the first chip carrier part 11. A second chip 14 is arranged on the second chip carrier part 12.

The first chip carrier part 11 is electrically connected to the negative potential DC− of the supply voltage. The first chip carrier part 11 comprises metal and also connects the undersides 131 and 151 of the first chip 13 and of the third chip 15 to the first potential DC− of the supply voltage. The second chip carrier part 12 is fitted at a distance d from the first chip carrier part 11, which distance must not be undershot in order that a breakdown between the chip carrier parts does not occur.

The second potential DC+ of the supply voltage is connected to a contact area situated on the underside of the second chip 14 via the electrically conductive second chip carrier part 12, which likewise comprises metal. The first chip 13 and the second chip 14 contain power transistors. The latter in each case have two terminals for the load path and a control terminal. The control terminals are driven by the third chip 15, which contains a drive logic.

The connection of the power transistors via the metallic leads 11 and 12 has particularly low impedance. Accommodating the three chips 15, 14 and 13 in one housing results in a particularly compact design.

FIG. 2, which is subdivided into FIGS. 2A and 2B, shows applications for the power semiconductor devices according to an embodiment. Motor bridges for DC voltage motors are involved in each case. The circuit diagram designated by PMSM involves a permanent magnet synchronous motor, in which the rotor contains a permanent magnet. The circuit diagram BLDC shows the driving of a brushless DC voltage motor that is self-commutating.

The chart SCR illustrates in a circuit diagram how, in the phases A, B and C, the coils A, B and C are driven by means of the high-side switches Q1, Q3 and Q5 and low-side switches Q0, Q2 and Q4.

The drive circuits for the motors in FIG. 2 in each case contain three high-side switches Q1, Q3 and Q5, and also three low-side switches Q0, Q2 and Q4. The high- and low-side switches are in each case formed as IGBT transistors (IGBT=Isolated Gate Bipolar Transistor) with freewheeling diodes connected in parallel. The high-side switches are connected to the positive potential DC+ and the low-side switches are connected to the negative potential DC−.

An IGBT driver is accommodated in a further chip and drives the control inputs by means of the signals PWM1, PWM2, PWM3, PWM4, PWM5, PWM6. Three coils A, C and B are connected to one another at in each case a first terminal. A high-side switch and a low-side switch are in each case connected in series with one another. The second terminals of the coils A, B and C are in each case connected to the junction points between low-side switches and high-side switches.

FIG. 3 shows a further application for the power semiconductor devices according to an embodiment. This involves step-down controllers that convert an input voltage $U_e$ into an output voltage $U_a$. They in each case contain a high-side switch HSS, $HSS_1$, $HSS_2$ connected in series with a low-side switch LSS, $LSS_1$, $LSS_2$. The high-side switches and low-side switches are in each case formed as an n-MOSFET. The first terminal of a coil L, $L_1$, $L_2$ is connected to the junction point between high-side switches and low-side switches, second terminals of said coil being connected to a capacitance C, $C_1$, $C_2$.

The high-side switches and low-side switches can be accommodated together in a power semiconductor device 1 by accommodating a chip with a low-side switch on a first chip carrier part and a chip with a high-side switch on a second chip carrier part.

Figure 4:
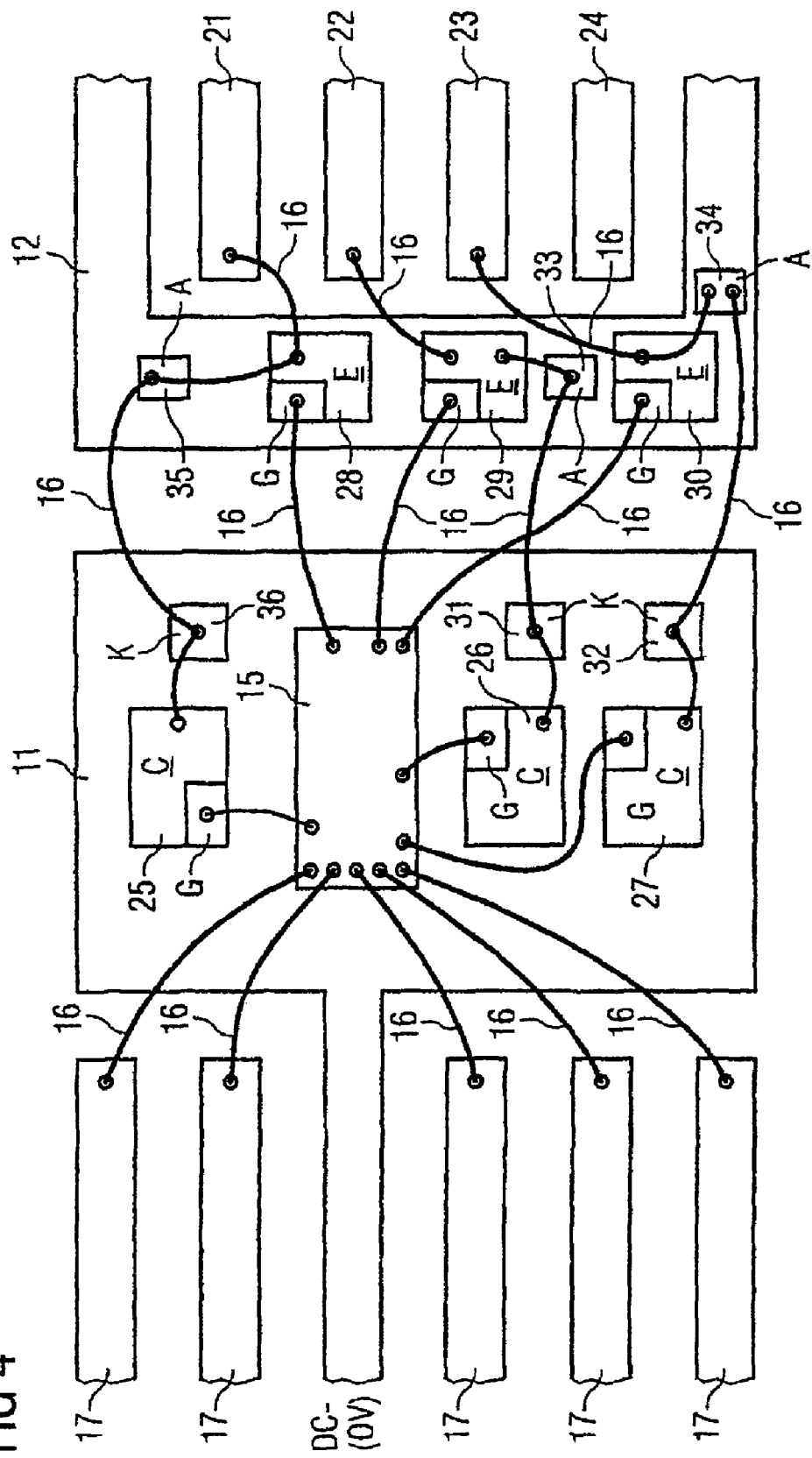
FIG. 4 shows a power semiconductor device according to an embodiment in plan view.

FIG. 4 shows a power semiconductor device according to an embodiment in plan view. The power semiconductor device according to an embodiment contains a leadframe composed of a multiplicity of leads 11, 12, 17, 21, 22, 23, 24 and also a multiplicity of chips 15, 25, 26, 27, 30, 31, 32, 33, 34, 35, 36. The drive chip 15, the IGBT 25, the IGBT 26 and the IGBT 27, and also the diodes 31, 32 and 36 are arranged on the first chip carrier part 11, which is formed as a lead.

The emitter terminals of the IGBT power transistors 25, 26 and 27 are connected on their underside to the first chip carrier part 11 via a diffusion soldering connection.

There is likewise a connection between the anodes lying on the undersides of the diodes 31, 32 and 36 to the first chip carrier part 11.

The control chip 15 controls the control inputs G of the power transistors 25, 26 and 27.

The chips 28, 29 and 30 contain power transistors whose underside contains the collector terminal. The latter is electrically connected to the second chip carrier 12 via a diffusion soldering connection.

The terminals for the emitter E and also the terminals for the gate G are situated on the top sides of the chips 28, 29 and 30. Furthermore, the chips 33, 34 and 35, formed as diodes, are situated on the second chip carrier part 12. The cathode terminals of the diodes lie on the underside and are likewise electrically connected to the second chip carrier part 12 via a diffusion soldering connection.

The chips 25, 36, 28 and 35 form a half-bridge, the chip 28 forming the high-side switch and the chip 25 forming the low-side switch. The chips 36 and 35 contain the freewheeling diodes.

The chips 26, 31, 29 and 33, and also the chips 27, 32, and 34, equally form a half-bridge in each case.

The chip 15 for driving the control inputs of the transistors 25, 28, 29, 30, 27 and 26 is fitted on the first chip carrier part 11. It receives input signals from the leads 17 and drives the control inputs of the power transistors. The connections between the leads and the chips and also the connections between the chips, if they are not effected via the diffusion soldering connection between chip and chip carrier part, are realized by means of bonding wires 16.

Figure 5:
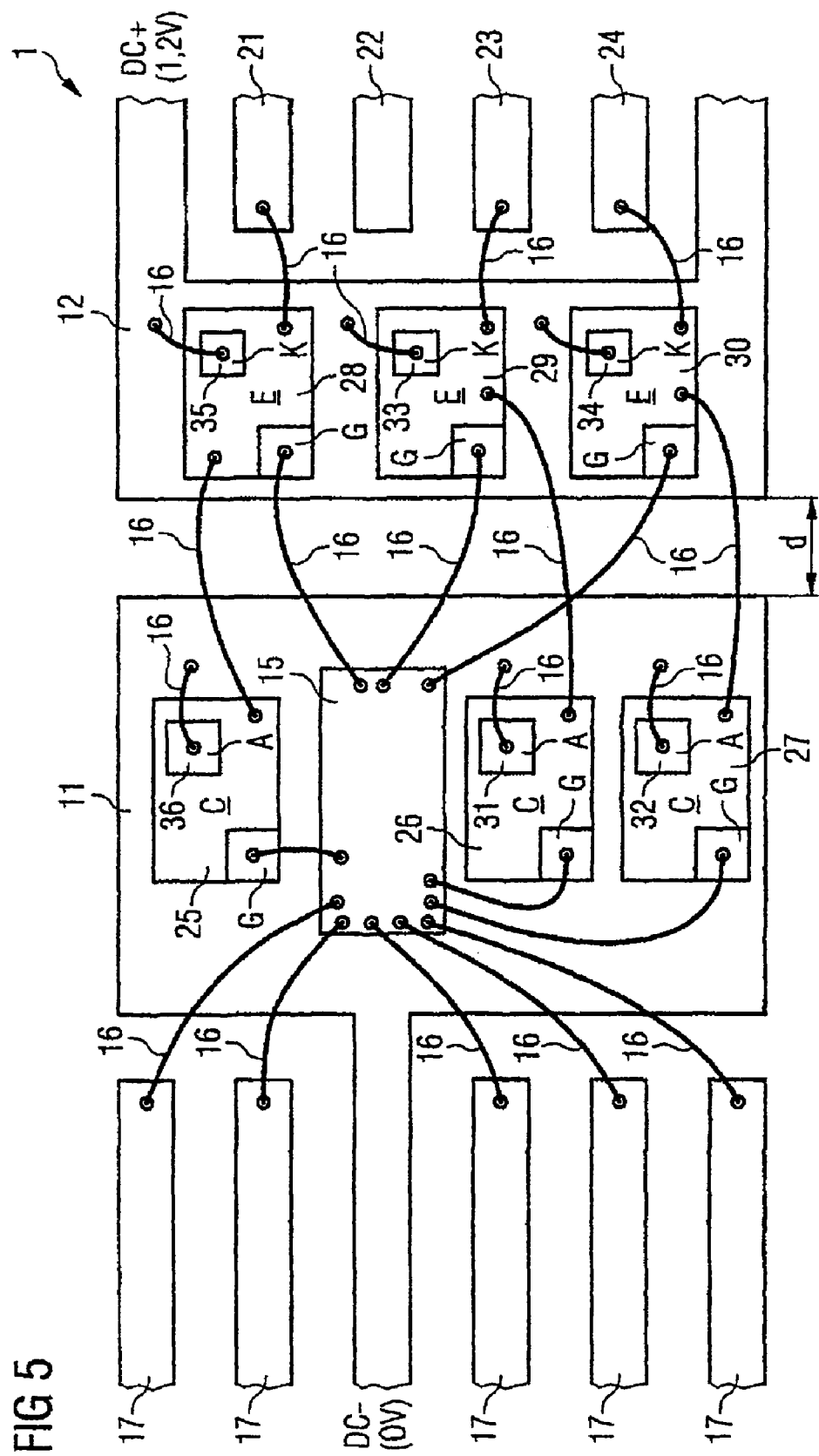
FIG. 5 shows, in a further embodiment, a power semiconductor device in plan view.

FIG. 5 shows another exemplary embodiment of a power semiconductor device. In contrast to FIG. 4, the chips 36, 31, 32, 34, 33, 35 are applied in each case on the respective chips of the power transistors 25, 26, 27, 30, 29, 28. In this case, the chips 31, 32 and 36 are applied on the chips 25, 26 and 27, respectively, with their cathode side downward. The connections between the collectors of the power transistors and the cathode terminals of the power transistors are effected via diffusion soldering connections.

The chips 34, 33 and 35 are correspondingly applied with their diodes in such a way that the anode terminals point downward and are connected to the emitter terminals of the chips 30, 29 and 28 via diffusion soldering connections. The cathode terminals of the transistors 34, 33 and 35 are in each case connected to the second chip carrier part 12 via bonding wire connections. At the same time, the anode terminals of the chips 36, 31 and 32 are electrically connected to the first chip carrier part 11 via bonding wires 16.

It should be noted that the power transistors which are situated on the first chip carrier part 11 are oriented differently than the power transistors on the second chip carrier part 12. Since the emitter terminals of the power transistors 25, 26 and 27 point downward, the terminal for the control input must be led from the underside of the chips 25, 26 and 27 onto the topside. This is preferably effected by means of a connection through the chip which is produced by an etching through the chip and subsequent filling with a metal.

The first chip carrier part 11 is electrically connected to the negative potential, which is at 0 volts, while the second chip carrier part 12 is connected to the positive potential of the supply voltage, which is at 1200 V.

Figure 6:
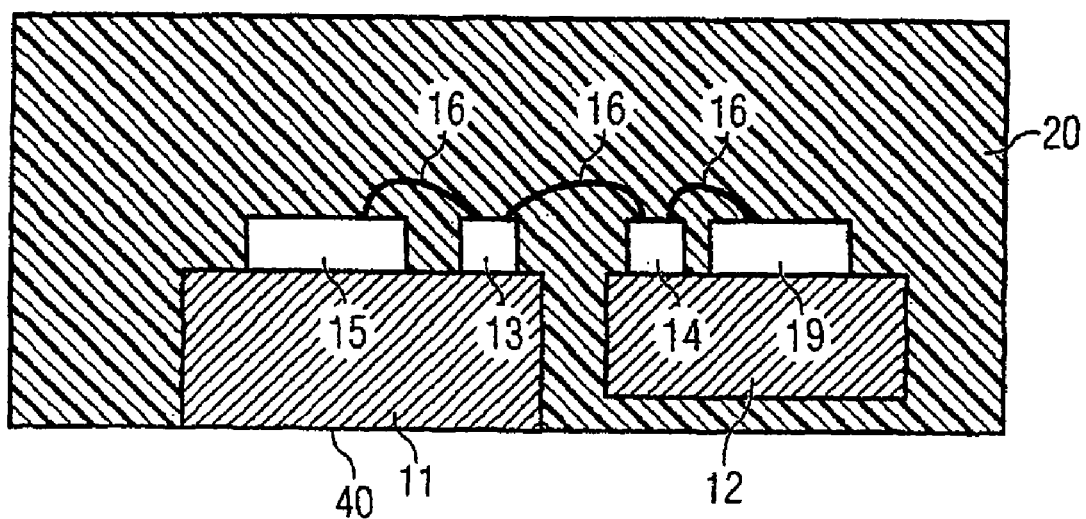
FIG. 6 shows an embodiment of a power semiconductor device in cross section.

FIG. 6 shows the cross section of a further embodiment of the semiconductor device. A first chip carrier part 11 with chips 13 and 15 situated thereon is fitted in a molding composition 20. Furthermore, a second chip carrier part 12 with chips 14 and 19 situated thereon is situated in the molding composition 20. The second chip carrier part 12 is enclosed by the molding composition 20 from all sides, while the first chip carrier part 11 is externally accessible at its underside 40. This is particularly important if a heat sink is intended to be fitted to the power semiconductor device externally and said heat sink is intended to be thermally connected to the first chip carrier part 11 particularly well.

Figure 7:
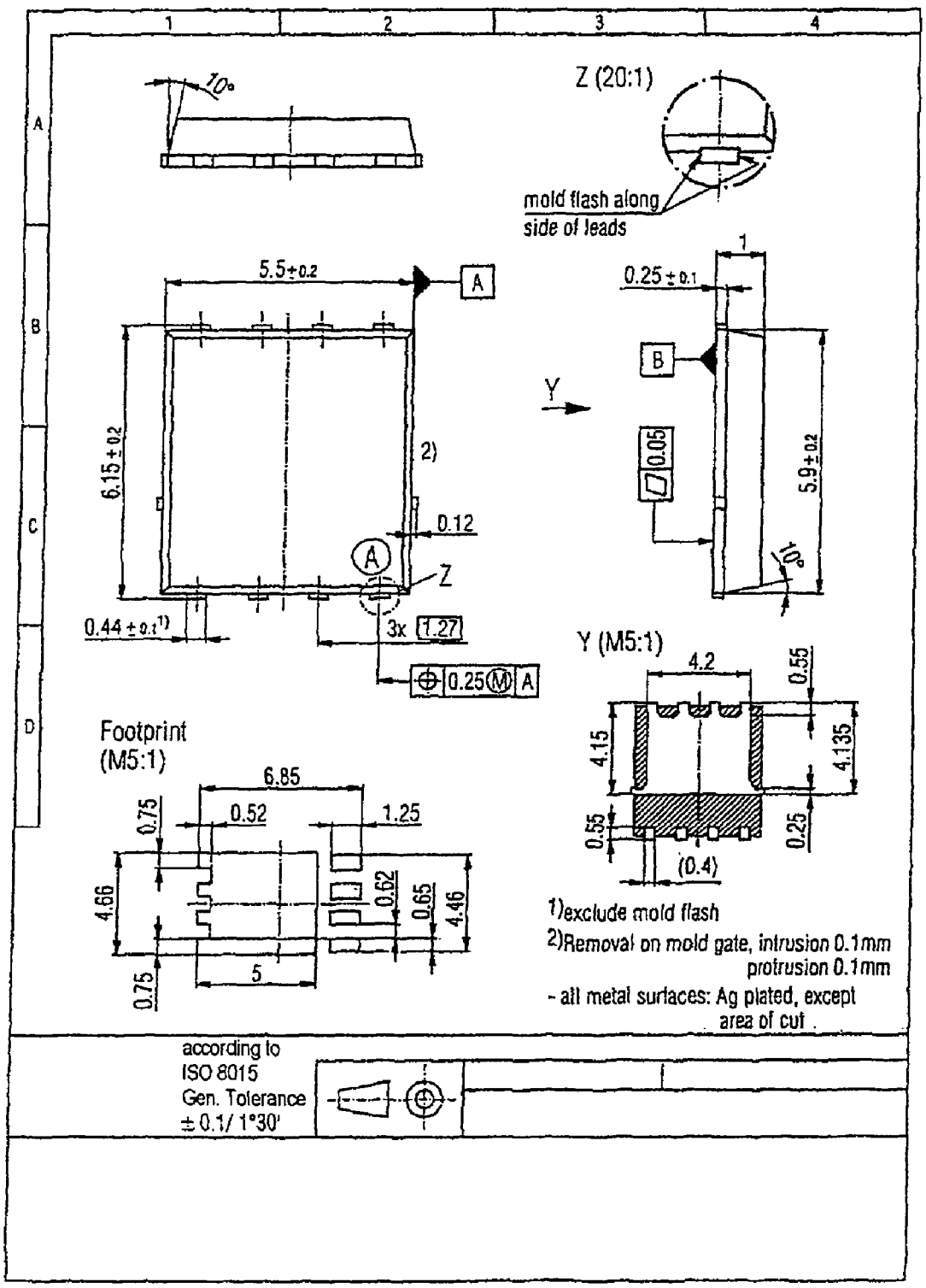
FIG. 7 shows a PowerQFN housing into which a power semiconductor device according to an embodiment can be integrated.
Figure 8:
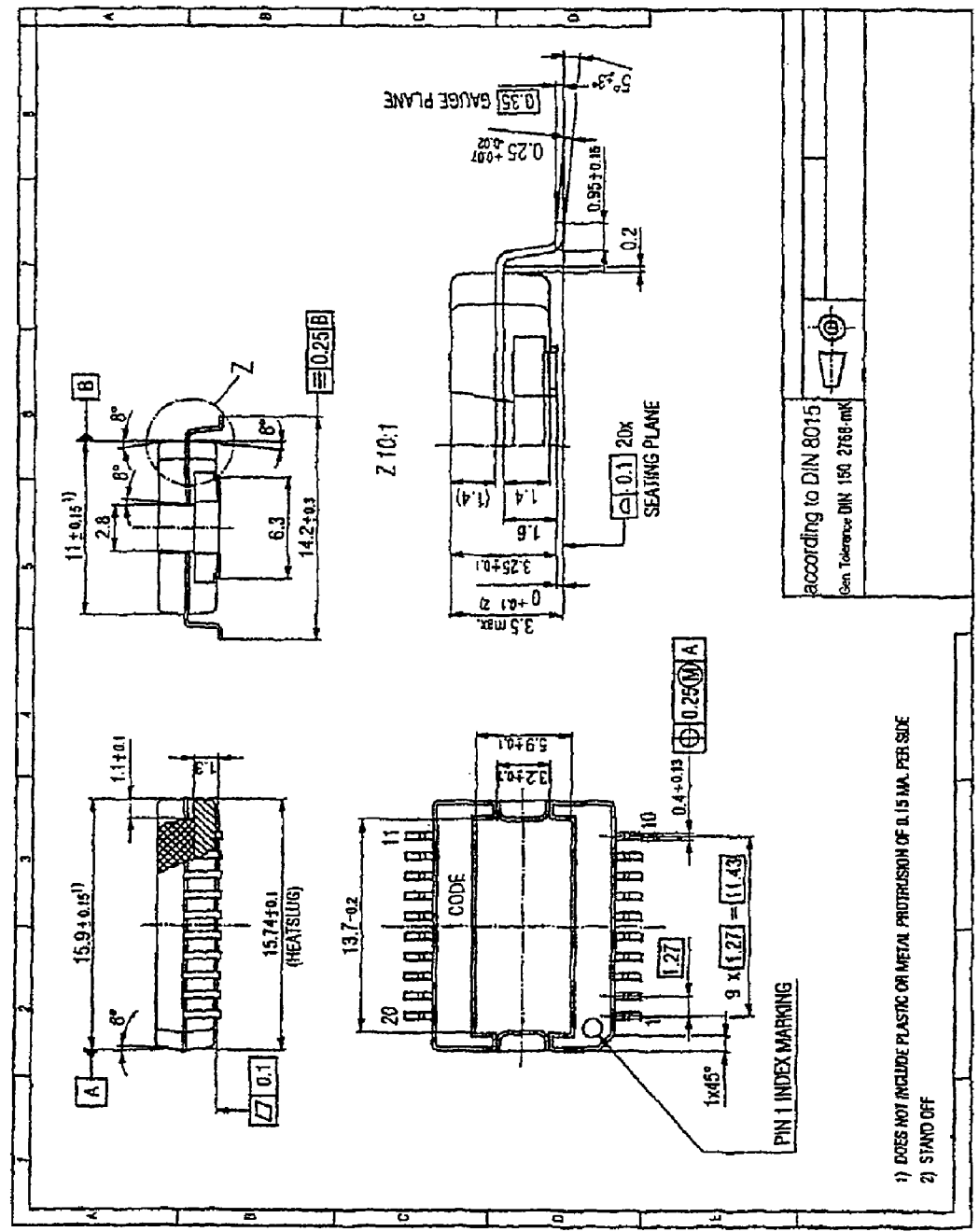
FIG. 8 shows a PowersSO housing into which a power semiconductor device according to an embodiment can be integrated.

FIGS. 7 and 8 show the dimensions of standard power QFN and D50-36-10 housings, respectively, in which the power semiconductor devices according to an embodiment can be accommodated.

LIST OF REFERENCE SYMBOLS

1 Power semiconductor device
11 First chip carrier part
12 Second chip carrier part
13 First chip
14 Second chip
15 Third chip
16 Bonding wire
17 Lead
18 Lead
19 Chip
20 Molding composition
21, 22, 23, 24 Lead
25, 26, 27, 28, 29, 30 Chip
31, 32, 33, 34, 35, 36 Chip
409 Underside
151 Underside
131 Underside

What is claimed is:

1. A power semiconductor device comprising:
a chip carrier having a first chip carrier part and at least one second chip carrier part, the first chip carrier part and the second chip carrier part being at a distance from one another and being electrically conductive in each case,
a first chip comprising a power transistor and arranged on the first chip carrier part such that a control input of the power transistor of the first chip faces toward the first chip carrier part,
a second chip comprising a power transistor and arranged on the second chip carrier part such that a control input of the power transistor of the second chip faces away from the second chip carrier part,
first and second terminals for a supply voltage between a first potential and a second potential,
a third chip comprising an integrated drive circuit, configured to drive the power transistors, disposed on one of the chip carrier parts, and
a leadframe of the power semiconductor device,
wherein the first terminal is electrically connected to the first chip carrier part and the second terminal is electrically connected to the second chip carrier part, and wherein an electrical connection of the first chip to the first potential is effected via the first chip carrier part, and an electrical connection of the second chip to the second potential is effected via the second chip carrier part, and
wherein each of the first chip carrier part and the second chip carrier part is a lead, the leads both being part of the leadframe of the power semiconductor device.

2. The power semiconductor device according to claim 1, wherein the power semiconductor device comprises a housing composed of a molding composition which encloses the first chip, the second chip and at least one of the chip carrier parts.

3. The power semiconductor device according to claim 2, wherein at least one side of one of the chip carrier parts is accessible from outside the housing.

4. The power semiconductor device according to claim 1, wherein the first chip and the second chip are arranged on the first chip carrier part and the second chip carrier part, respectively, in each case by means of diffusion soldering connections.

5. The power semiconductor device according to claim 1, wherein the control input of the power transistor of the first chip is electrically connected to a control terminal via a feedthrough through the chip, wherein the control terminal is disposed on a side of the first chip facing away from the first carrier part.

6. The power semiconductor device according to claim 1, wherein a first contact layer is disposed between the first chip carrier part and the first chip and a second contact layer is disposed between the second chip carrier part and the second chip.

7. The power semiconductor device according to claim 1, wherein the power transistors are MOSFETs, IGBTs, thyristors or bipolar transistors.

8. The power semiconductor device according to claim 1, comprising at least one bridge circuit with a high-side switch and a low-side switch,
wherein the low-side switch is integrated in the first chip and the high-side switch is integrated in the second chip.

9. The power semiconductor device according to claim 8, further comprising a third chip with a diode and a fourth chip with a diode,
wherein the first chip and the third chip are arranged on the first chip carrier part and are electrically conductively connected to the first chip carrier part by a respective contact area on their sides lying at the bottom, and
wherein the second chip and the fourth chip are arranged on the second chip carrier part and are electrically conductively connected to the second chip carrier part by a respective contact area on their sides lying at the bottom.

10. The power semiconductor device according to claim 8, comprising three chips with high-side switches and three chips with low-side switches and six diodes, and in which the low-side switches and three diodes are applied on the first chip carrier part and the high-side switches and three diodes are applied on the second chip carrier part.

11. The power semiconductor device according to claim 9, wherein a chip with a diode is in each case applied on the chips with high-side switches and on the chips with a low-side switch.

12. The power semiconductor device according to claim 1, comprising at least one further chip containing a control circuit.

13. The power semiconductor device according to claim 1, comprising a TO or PowerSO housing.

14. The power semiconductor device of claim 1, wherein a source side of one of the first and second chips faces away from the respective one of the first and second carrier parts, and a drain side of the other of the first and second chips faces away from the respective other one of the first and second carrier parts.

15. A method for producing a power semiconductor device, the method comprising:
providing an electrically conductive first chip carrier part and an electrically conductive second chip carrier part, the first chip carrier part being connected to a terminal for a first potential of a supply voltage and the second chip carrier part being connected to a terminal for a second potential of the supply voltage,
arranging a first semiconductor chip on the first chip carrier part and a second semiconductor chip on the second chip carrier part in such a way that an electrical connection is produced between a contact area of the first chip and the first chip carrier part and an electrical connection is produced between a contact area of the second chip and the second chip carrier part wherein a control input of the first semiconductor chip faces toward the first chip carrier part and a control input of the second semiconductor chip faces away from the second chip carrier part, and
arranging a third semiconductor chip comprising an integrated drive circuit configured to drive the first and second semiconductor chips on one of the chip carrier parts wherein the first and second chip carrier parts are each leads that are part of a leadframe of the power semiconductor device.

16. The method according to claim 15,
wherein the first semiconductor chip and the second semiconductor chip in each case has the control input on an active top side, and the control input of the first semiconductor chip is electrically connected to an external control terminal on a rear side of the first semiconductor via a feedthrough through the first semiconductor chip,
wherein the first semiconductor chip is arranged with its front side facing toward the first chip carrier part and the second semiconductor chip is arranged with its front side away from the second chip carrier part.

17. The method according to claim 15, further comprising applying a chip with a diode on each of the first chip and the second chip.

18. The method according to claim 15, wherein the first chip and the second chip are soldered on the first chip carrier part and second chip carrier part, respectively, in each case by means of diffusion soldering.

* * * * *